United States Patent
Sakuragi

(10) Patent No.: US 7,030,915 B2
(45) Date of Patent: Apr. 18, 2006

(54) SIGNAL PROCESSING APPARATUS

(75) Inventor: Takamasa Sakuragi, Hiratsuka (JP)

(73) Assignee: Canon Kabushiki Kaisha, Tokyo (JP)

(*) Notice: Subject to any disclaimer, the term of this patent is extended or adjusted under 35 U.S.C. 154(b) by 828 days.

(21) Appl. No.: 09/795,151

(22) Filed: Mar. 1, 2001

(65) Prior Publication Data

US 2001/0030699 A1 Oct. 18, 2001

(30) Foreign Application Priority Data

Mar. 2, 2000 (JP) .............................. 2000-057463
Mar. 3, 2000 (JP) .............................. 2000-059210

(51) Int. Cl.
*H04N 5/217* (2006.01)
*H04N 3/14* (2006.01)
*H04N 5/335* (2006.01)

(52) U.S. Cl. ..................................... 348/241; 348/300

(58) Field of Classification Search ................ 348/300, 348/294, 302, 308, 241, 243; 250/208.1; 327/382

See application file for complete search history.

(56) References Cited

U.S. PATENT DOCUMENTS

| | | | | |
|---|---|---|---|---|
| 4,371,797 A | * | 2/1983 | Frank | 327/382 |
| RE33,331 E | * | 9/1990 | Carlson | 327/410 |
| 5,825,056 A | * | 10/1998 | Yonemoto | 257/290 |
| 5,965,892 A | * | 10/1999 | Tanaka | 348/241 |
| 5,990,952 A | * | 11/1999 | Hamasaki | 348/311 |
| 6,518,910 B1 | * | 2/2003 | Sakuragi et al. | 341/118 |
| 6,784,928 B1 | * | 8/2004 | Sakurai et al. | 348/283 |
| 6,801,256 B1 | * | 10/2004 | Egawa et al. | 348/294 |

OTHER PUBLICATIONS

U.S. Appl. No. 09/236,352, Jan. 25, 1999.
U.S. Appl. No. 09/793,914, Feb. 28, 2001.

* cited by examiner

*Primary Examiner*—Ngoc-Yen Vu
*Assistant Examiner*—Jason Whipkey
(74) *Attorney, Agent, or Firm*—Fitzpatrick, Cella, Harper & Scinto

(57) ABSTRACT

A signal transfer gain is prevented from being lowered by parasitic capacitance. A signal processing apparatus is provided which includes switches provided for a plurality of signal sources, a common line to which signals from the plurality of signal sources are sequentially transferred, and a parasitic capacitance control circuit for controlling parasitic capacitance of the common line in accordance with the level of the signal on the common line.

4 Claims, 17 Drawing Sheets

SIGNAL PROCESSING APPARATUS

BACKGROUND OF THE INVENTION

1. Field of the Invention

The present invention relates to a signal processing apparatus having a common line through which a plurality of signals are sequentially read.

2. Related Background Art

A signal transmission circuit for transmitting signals from a plurality of signal sources via signal transfer switches to a common line is used, for example, in a solid state image pickup device.

An example of the solid state image pickup device is an amplification type MOS sensor. In the amplification type MOS sensor, generally, signal charges generated in each pixel are converted into voltage by using a capacitor, and then a signal is read from each capacitor by using a scanning circuit and signal transfer switches, without directly reading the signal charges themselves.

Each pixel of such a solid state image pickup device has a photoelectric conversion unit for generating signal charges corresponding to incidence light and an amplifier unit for performing impedance conversion of a signal voltage converted by a capacitor from the signal charges of the photoelectric conversion unit. The operation of outputting a signal voltage from an output terminal via an amplifier unit and a signal transfer unit of each pixel will be described with reference to FIG. 1 showing a solid state image pickup device with linearly disposed pixels.

In FIG. 1, S1 to Sn represent photoelectric conversion units of pixels. A1 to An represent amplifier units for converting signal charges supplied from the photoelectric conversion units S1 to Sn into voltages and amplifying them. Q1 to Qn represent MOS transistors functioning as switches for transferring signal voltages supplied from the amplifier units A1 to An to sample/hold capacitors CT1 to CTn. The MOS transistors Q1 to Qn turn on when a pulse φ1 applied to a terminal 104 takes a high potential, and turn off at a low potential. Qh1 to Qhn represent MOS transistors as switches which sequentially turn on in response to pulses φh1 to φhn supplied from a scanning circuit and sequentially transfer the signal voltages held by the sample/hold capacitors CT1 to CTn to a horizontal signal line 101. Qhr represents a MOS transistor as a switch which resets the horizontal signal line to a ground level during a period between sequential transfers of the signal voltages from the MOS transistors Qh1 to Qhn to the horizontal signal line 101. The MOS transistor Qhr turns on when a pulse φhr takes the high potential and turns off at the low potential. A buffer amplifier 3 receives the signal voltage on the horizontal signal line 101 and outputs the signal from an output terminal 102.

Although not shown in FIG. 1, the horizontal signal line 101 has a capacitance (hereinafter represented by Ch). This capacitance Ch is a total sum of capacitances Cdbn and Cgdn. The capacitances Cdbn are parasitic capacitances between the source/drain and substrate of the MOS transistors Qh1 to Qhn as the transfer switches and the MOS transistor Qhr as the reset switch. The capacitances Cgdn are called overlapping capacitances and are parasitic capacitances between the source/drain and gate of these transistors.

The operation of the solid state image pickup device will be described further with reference to the timing chart shown in FIG. 2.

During a period T1, the pulses φ1 and φhr take the high potential so that the MOS transistors Q1 to Qn and MOS transistor Qhr turn on. Therefore, the signal voltages are applied from the amplifier units A1 to An to the sample/hold capacitors CT1 to CTn via the MOS transistors Q1 to Qn, and at the same time, the potential of the horizontal signal line 101 takes the ground level. Thereafter, the pulse φ1 takes the low level so that the MOS transistors Q1 to Qn turn off and the output voltages from the amplifier units A1 to An are held in the sample/hold capacitors CT1 to CTn.

Next, during a period T2, the pulse φh1 takes the high potential so that the MOS transistor Qh1 turns on and the charges in the sample/hold capacitor CT1 are transferred to the parasitic capacitor Ch of the horizontal signal line 101. Therefore, the potential of the sample/hold capacitor CT1 is transmitted to the horizontal signal line 101 and a signal voltage is output from the output terminal 102 of the buffer amplifier.

Next, during a period T3, the pulse φhr takes the high potential so that the potential at the horizontal signal line 101 takes the ground level.

Similarly, during periods T4 to T6, the potentials held at the sample/hold capacitors CT2 to CTn are sequentially transmitted to the horizontal signal line 101 and output from the output terminal 102 of the buffer amplifier 3.

A change in the voltage at the output terminal 102 during the periods T1 to T6 is also shown in FIG. 2.

Another example of a conventional solid state image pickup device using clamp capacitors is shown in FIG. 3. The fundamental structure and operation are similar to the solid state image pickup device shown in FIGS. 1 and 2. However, as shown in FIG. 3, the sample/hold capacitors CT1 to CTn are removed from the structure shown in FIG. 1, and clamp capacitors C1 to Cn and MOS transistors Qr1 to Qrn as reset switches are inserted. A control terminal 105 is added for controlling on/off of the MOS transistors Qr1 to Qrn.

In operation of this conventional solid state image pickup device, when photoelectric conversion units S1 to Sn and amplifier units A1 to An receiving outputs of the photoelectric conversion units S1 to Sn output dark signals to vertical signal lines V1 to Vn, a pulse φr applied to a control terminal 105 takes the high potential so that the MOS transistors Qr1 to Qrn as the reset transistors turn on and the potentials at one ends of the clamp capacitors take the ground potential. Thereafter, when the photoelectric conversion units S1 to Sn and amplifier units A1 to An output photo-signals, the pulse φr applied to a control terminal 105 takes the low potential so that the MOS transistors Qr1 to Qrn turn off. When photo-outputs are output, the potentials at one electrodes of the clamp capacitors C1 to Cn on the sides of the MOS transistors Q1 to Qn change by an amount of (photo-output− dark output), and the potentials at the opposite electrodes of the clamp capacitors C1 to Cn also change by an amount of (photo-output−dark output) from the ground level. As a scanning circuit sequentially outputs pulses φh1 to φhn, signals stored in the clamp capacitors C1 to Cn are transferred to a common horizontal signal line 101 and output from an output terminal 102 of a buffer amplifiers 3. Similar to the device shown in FIG. 2, the horizontal signal line 101 takes the ground level at the high potential of a pulse φhr during a period between sequential outputs of the pulses φh1 to φhn from the scanning circuit.

In the conventional device shown in FIG. 1, when a signal is transferred from each of the sample/hold capacitor CT1 to CTn to the parasitic capacitor Ch of the horizontal signal line 101, a signal transmission gain at the n-stage of signal transfer is CTn/(CTn+Ch) which is smaller than 1. An S/N ratio is therefore lowered. The transmission gain and S/N ratio lower more as the number of pixels of the device is increased and the number of MOS transistors Qh1 to Qhn shown in FIG. 1 is increased, because this increase of the numbers results in increase of a total sum of the parasitic capacitances between the drain—back gate of the MOS transistors Qh1 to Qhn and the parasitic capacitances between the gate—drain and therefor the capacitance Ch increases.

FIG. 4 is a schematic diagram showing two parasitic capacitances of the capacitance Ch. Reference numeral 11 represents the gate of a MOS transistor, reference numerals 12 and 13 represent its source and drain regions, reference numeral 14 represents a bulk substrate, and reference numeral 15 represents an oxide layer. One capacitance constituting the capacitance Ch is a PN junction capacitance between the source region 12 and substrate 14 or between the drain region 13 and substrate 14. If the transistor shown in FIG. 4 is an NMOS transistor, the bulk substrate is generally connected to a ground electrode so that the PN junction capacitance is formed relative to the ground line.

The other capacitance constituting the capacitance Ch is a capacitance having the oxide layer as its dielectric layer in the overlapped areas 21 and 22 shown in FIG. 4 between the gate 11 and source/drain 12, 13.

The overlapping parasitic capacitances between the gate and drain/source of the MOS transistors Qh1 to Qhn shown in FIG. 1 constitute the capacitance Ch. The gates of the MOS transistors Qh1 to Qhn are driven by the scanning circuit which are a gate circuit made of CMOS inverters or the like. Therefore, one electrode (gate) of the overlapping capacitance between the gate and drain/source is connected via an on-resistance of the driver gate circuit of CMOS inverters or the like to the high potential power source or low potential power source (generally ground potential) of this circuit.

FIG. 5 is a schematic diagram showing a MOS transistor Qhn and a portion of a scanning circuit. In FIG. 5, like elements and pulses to those shown in FIG. 1 are represented by using identical reference symbols.

In FIG. 5, Qhn represents a MOS transistor as a switch for transferring a signal from a capacitor CTn to a capacitor Ch, 101 represents a horizontal signal line, and Lhn represents a signal line for controlling on/off of the MOS transistor Qhn. The capacitor Ch is constituted of an overlapping parasitic capacitor 35 between the gate and source/drain of the MOS transistor Qhn and a PN junction parasitic capacitor 36 between the drain and substrate of the transistor Qhn. A CMOS inverter in the scanning circuit for driving the gate of the MOS transistor Qhn is made of a PMOS transistor 32 and an NMOS transistor 33. The CMOS inverter is powered by a high potential power source 31.

The conventional device shown in FIG. 3 has also a similar problem. When signal charges in the clamp capacitors C1 to Cn are transferred to the parasitic capacitor Ch of the common horizontal signal line 101, the signal transfer gain is lowered to Cn/(Cn+Ch).

FIG. 6 is a schematic diagram showing another conventional MOS type solid state image pickup device. As shown in FIG. 6, sensor cells 1 are two-dimensionally disposed in a matrix shape. The sensor cell 1 is activated or reset by a signal 2 (2-1, 2-2, . . . ) supplied from a vertical shift resister 11.

The output terminal of each sensor cell 1 is connected to a vertical signal line 5 (5-1, 5-2, . . . , 5-n). A signal voltage generated in the sensor cell 1 appears on this vertical signal line 5 and is stored in a clamp capacitor 3 (3-1, 3-2, . . . , 3-n) in the form of electric charges. In many cases, fluctuation in the signal charges generated in the sensor cells 1 is cancelled by unrepresented switches, capacitors and the like. By sequentially turning on horizontal select switches 4 (4-1, 4-2, . . . , 4-n) by horizontal select signals 7 (7-1, 7-2, . . . , 7-n) supplied from a horizontal shift register 12, signal charges in the clamp capacitors 3 are transferred via a horizontal signal line 6 to the inverting input terminal of a differential amplifier 9 having a negative feedback capacitor 8 and output from an output terminal 13 in the form of voltage. The non-inverting input terminal of the differential amplifier 9 is connected to a reference voltage source 10.

In this solid state image pickup device, the horizontal select switch 4 is generally made of a MOS transistor. For example, an NMOS transistor such as shown in FIG. 7 is used as the horizontal select switch 4. In FIG. 7, reference numeral 21 represents a gate, reference numeral 22 represents source and drain diffusion regions made of n-type semiconductor, reference numeral 23 represents a p-type well diffusion region, and reference numeral 25 represents an oxide layer. As seen from FIG. 7, a PN junction capacitor is formed between the source/drain region 22 and the p-type well region 23. Since the p-type well region 23 is generally connected to the lowest ground potential in a semiconductor integrated circuit, the source/drain region 22 has a PN junction capacitor using the ground as its one electrode (this PN junction capacitance is represented by Cj hereinafter). Reference numeral 24 represents overlapped areas between the gate 21 and source/drain regions 22 caused by lateral diffusion of the source/drain regions. A so-called overlapping capacitance (hereinafter represented by Cov) is therefore formed between the gate 21 and source/drain region by using the gate oxide layer 25 as the capacitor dielectric layer.

The horizontal signal line 6 shown in FIG. 6 has capacitors 15 and 16 shown in the equivalent circuit of FIG. 8 because the horizontal select switches have the above-described parasitic capacitances Cj and Cov. The equivalent circuit shown in FIG. 8 corresponds to a signal transmission path from the vertical signal lines to the output terminal 12 shown in FIG. 6.

Referring to FIG. 8, reference numeral 5 (5-1, 5-2, . . . , 5-n) represents a vertical signal line, reference numeral 3 (3-1, 3-2, . . . , 3-n) represents a clamp capacitor, reference numeral 4 (4-1, 4-2, . . . , 4-n) represents a horizontal transfer switch, reference numeral 6 represents a horizontal signal line, reference numeral 7 (7-1, 7-2, . . . , 7-n) represents a horizontal select line of a horizontal shift register 12, reference numeral 8 represents a negative feed back capacitor of an output amplifier 9 for converting a signal charge into a voltage signal, and reference numeral 14 (14-1, 14-2, . . . , 14-n) represents an output impedance of a drive gate in the shift resister 12 for driving the horizontal select line 7. In the example shown in FIG. 8, the horizontal transfer switch 4 is made of an NMOS transistor. At an "L" level of the horizontal select line 7 at which level the horizontal transfer switch turns off, the drive gate has the output impedance 14 relative to the ground. Reference numeral 15 (15-1, 15-2, . . . , 15-n) represents a PN junction parasitic capacitor between the source and well of the NMOS transistor of the horizontal transfer switch 4. Reference numeral 16 (16-1, 16-2, . . . , 16-n) represents an overlapping capacitor between the gate and source of the NMOS transistor 4. As seen from FIG. 8, the horizontal signal line 6 has the total capacitor Ctot=n×(Cj+Cov) where n is the number of vertical signal lines of the solid state image pickup device. If the total number of pixels of the solid state image pickup device is several hundred thousands to several millions, the parasitic capacitance Ctot becomes as large as several pF to several tens pF. This parasitic capacitance Ctot is driven by the output amplifier 9. The equivalent circuit including the capacitance Ctot as viewed from the output amplifier 9 is shown in FIG. 9.

In FIG. 9, reference numeral 9 represents an output amplifier, reference numeral 8 represents a negative feedback capacitor, $r_0$ represents an equivalent output impedance of the output amplifier 9, and $V_N$ represents an input referred random noise source of the output amplifier 9. Therefore, the output amplifier 9 shown in FIG. 8 is an ideal amplifier having the output impedance of 0 and a random noise of 0. A transmission function from the output of the output amplifier 9 to its inverting input terminal (−) is represented by:

$$(1/SC_{tot})/(1/SC_N)+(1/SC_{tot})+r_0))=C_N/(C_N+C_{tot}+SC_N \cdot C_{tot} \cdot r_0)$$

where S ia a Laplace operator and $C_N$ is a capacitance value of the negative feedback capacitor 8.

As apparent from this equation, the transmission function takes the form of a low-pass filter whose cut-off frequency is influenced by the value of the parasitic capacitance $C_{tot}$. Therefore, the bandwidth of the output amplifier 9 is narrowed by the parasitic capacitance $C_{tot}$ and the output drive speed lowers.

Furthermore, random noises ($V_N$) of the output amplifier is amplified by the parasitic capacitance $C_{tot}(V_N \times (C_{tot}/C_N))$.

SUMMARY OF THE INVENTION

It is an object of the invention to suppress a signal level from being lowered by a capacitance division when the signal is read to a common line.

In order to achieve the above object, one aspect of the invention provides a signal processing apparatus comprising: a common line for reading a plurality of signals from a plurality of signal sources; a plurality of switching means for transferring the signals from the signal sources to the common line; and parasitic capacitance controlling unit for controlling a parasitic capacitance of the common line by using a control signal depending on a change in a signal level of the common line caused when the signals are read via the switching means to the common line.

Another aspect of the present invention provides a signal processing apparatus comprising: a common line for reading a plurality of signals from a plurality of signal sources; a plurality of switching means for transferring the signals from the signal sources to the common line; and parasitic capacitance controlling unit for controlling to change a potential at one electrode of a parasitic capacitance of the common line in accordance with a change in a signal level of the common line when the signals are read via the switching means to the common line, wherein the one electrode side is not connected to the common line.

Another aspect of the present invention provides a signal processing apparatus comprising: a common line for reading a plurality of signals; a plurality of transfer transistors, one main electrode region of each of the transfer transistors being connected to the common line and another main electrode region receiving the signal to transfer the signal to the common line; and an input circuit adapted to input the signal on the common line to control electrode terminals of the transfer transistors or to a substrate terminal of the transfer transistors.

Another aspect of the present invention provides a signal processing apparatus comprising: a common line for reading a plurality of signals; a plurality of transfer transistors, one main electrode region of each of the transfer transistors being connected to the common line and another main electrode region receiving the signal to transfer the signal to the common line; and a signal line adapted to input the signal on the common line to a substrate terminal of the transfer transistors.

Another aspect of the present invention provides a signal processing apparatus comprising: a common line for reading a plurality of signals; a plurality of transfer transistors, one main electrode region of each of the transfer transistors being connected to the common line and another main electrode region receiving the signal to transfer the signal to the common line; and a scanning circuit adapted to apply a pulse to a control electrode of each of the transfer transistors, wherein the scanning circuit generates a signal having a level for turning off each of the transfer transistors in accordance with the signal on the common line.

Other objects and features of the present invention will become apparent from the following detailed description of embodiments when read in conjunction with the accompanying drawings.

DETAILED DESCRIPTION OF THE PREFERRED EMBODIMENTS

First, the common concept of the first to fourth embodiments to be described later will be explained.

Figure 5:
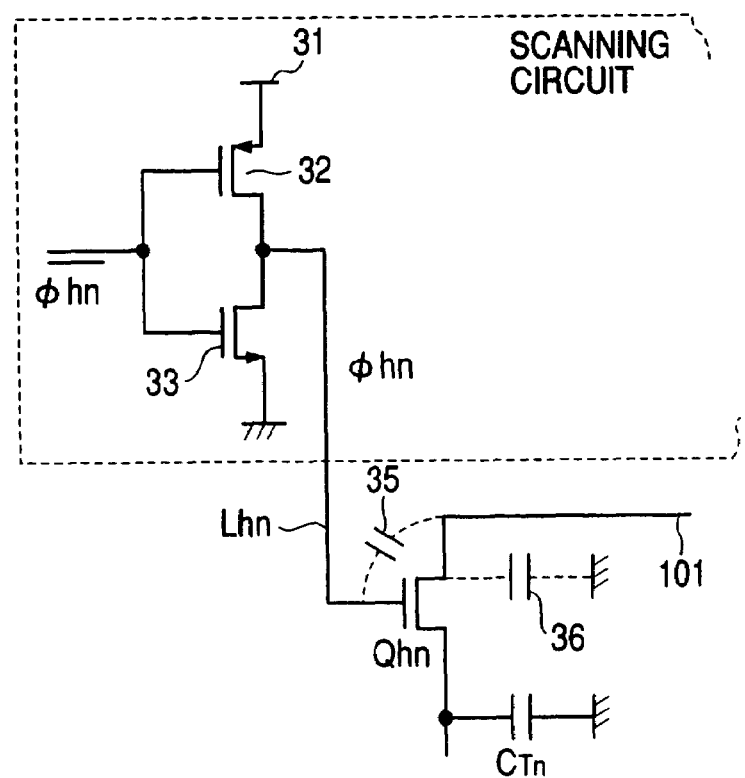
FIG. 5 is a schematic diagram showing a MOS transistor Qhn and a portion of a scanning circuit.
Figure 6:
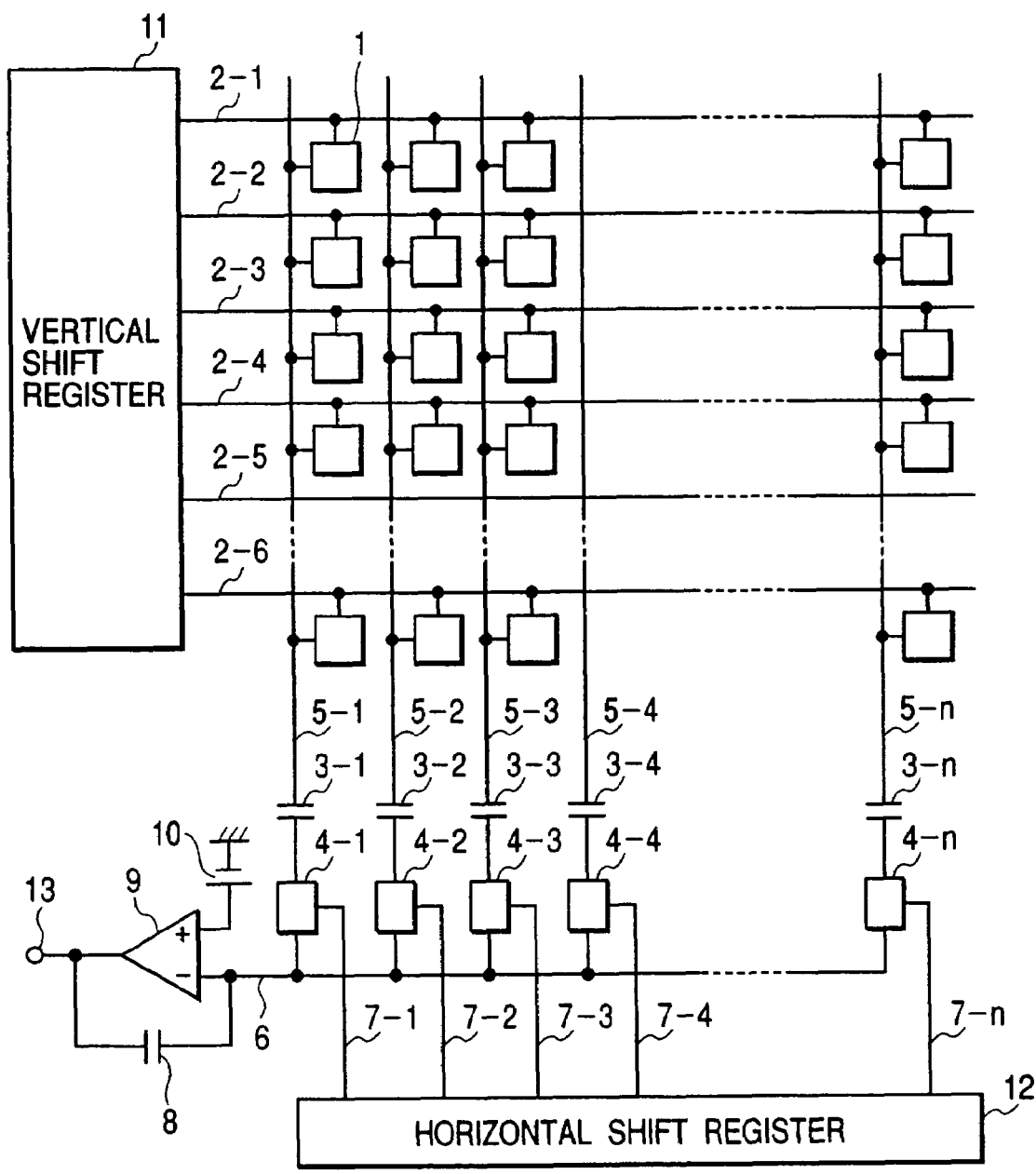
FIG. 6 is a schematic diagram showing the structure of a conventional MOS type solid state image pickup device.
Figure 7:
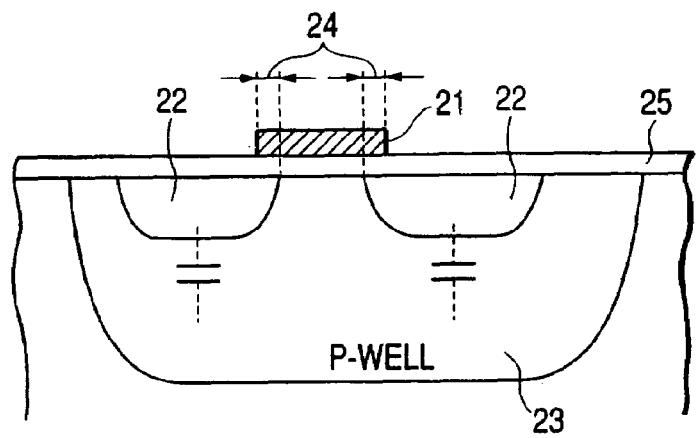
FIG. 7 is a cross sectional view illustrating parasitic capacitances of a MOS transistor.
Figure 8:
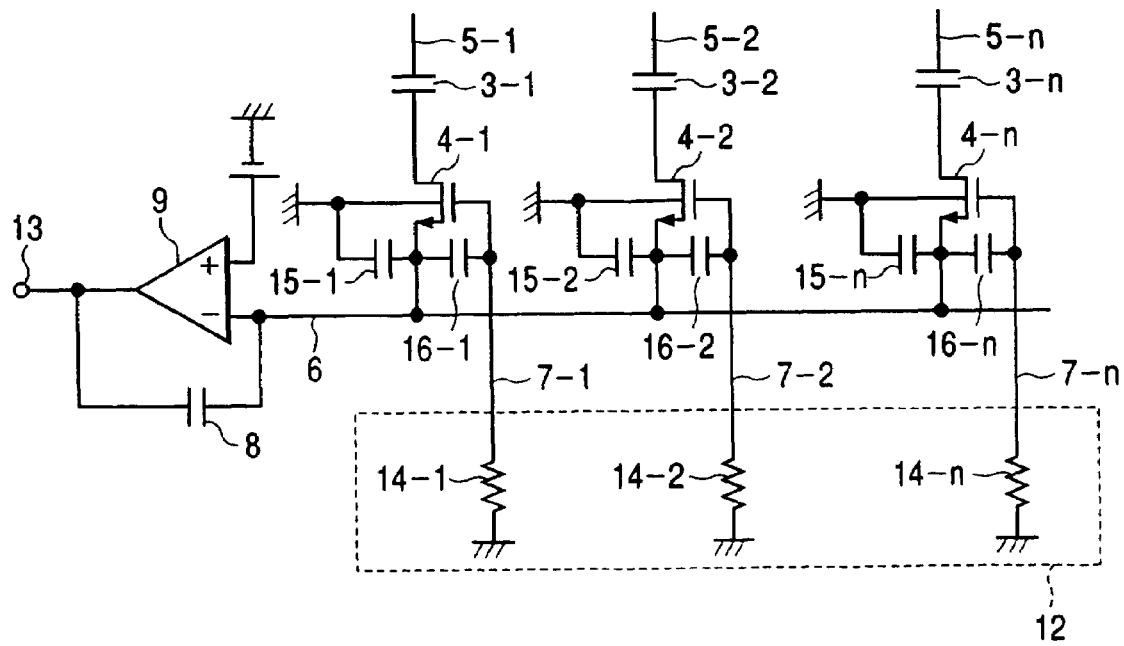
FIG. 8 is an equivalent circuit illustrating a problem associated with a conventional solid state image pickup device.
Figure 9:
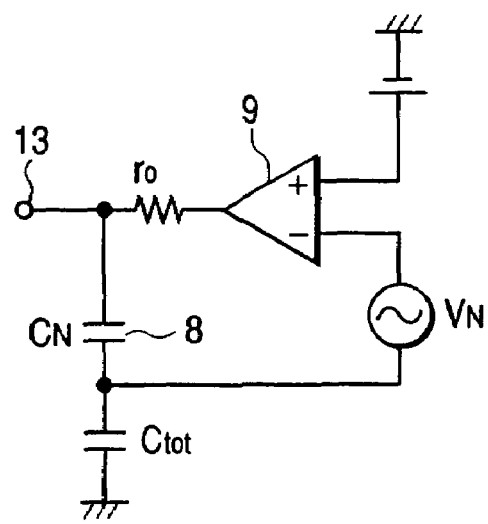
FIG. 9 is an equivalent circuit illustrating a problem associated with a conventional solid state image pickup device.
Figure 10:
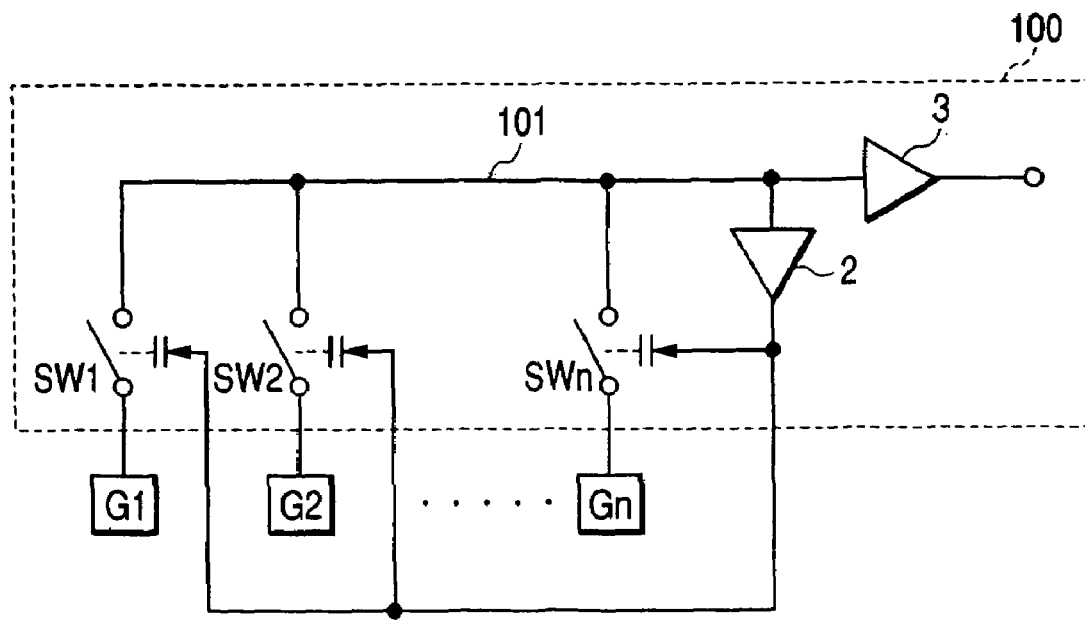
FIG. 10 is a circuit diagram of a signal transmission circuit.

The circuit structure shown in FIG. 10 is used for solving the problem that a voltage gain is lowered by a parasitic capacitance of a common line through which signals from signal sources are transferred, for example, the problem that a voltage gain is lowered if a signal is transferred from the capacitance CTn shown in FIG. 5 to the capacitance Ch. Reference numeral 100 in FIG. 10 represents a signal transmission circuit.

When signals from a plurality of signal sources G1 to Gn are output to a common line 101 via switches SW1 to SWn, parasitic capacitance (in this case, parasitic capacitance of the switch) of the common line 101 is controlled by the transfer signal level at the common line 101 (transfer signal level itself or a signal added with a d.c. offset voltage by a buffer amplifier or the like), so as to remove or reduce a potential change between the electrodes of the parasitic capacitance so that electric charge transfer is substantially removed or reduced and an apparent parasitic capacitance value becomes zero or is reduced.

The parasitic capacitance includes not only the parasitic capacitance of the switch but also parasitic capacitance of other elements connected to the common signal line. The latter parasitic capacitance can also be controlled similar to the parasitic capacitance of the switch. The control of the parasitic capacitance of the switch is not limited only to the signal level at the common signal line, but the control of the parasitic capacitance may be performed by using a signal generator or the like which can provide a voltage change same as that on the common signal line (i.e., by using a signal corresponding to the signal output via the switch).

The invention will be described more specifically with reference to FIG. 5.

Of the two electrodes of each of the parasitic capacitances 35 and 36 constituting the capacitance Ch, the electrode not connected to the horizontal signal line (common line) 101 is applied with a potential equal to that of the horizontal signal line (common line) 101 or such the potential added with a d.c. offset voltage by using an input unit such as a buffer circuit. In this manner, a voltage across the two electrodes of each of the parasitic capacitances 35 and 36 can be made constant (or the voltage change can be suppressed). Therefore, when a signal voltage is transferred from the capacitor CTn in the form of signal charges, the signal charges do not enter the parasitic capacitances 35 and 36. The signal transfer gain can therefore be increased more than that of a conventional circuit, and an S/N ratio can be improved.

The circuit structure shown in FIG. 10 and described above is suitable for use with a solid state image pickup device. However, the application of this circuit is not limited only to the solid state image pickup device, but this circuit may be applied to semiconductor memories and other display devices such as flat display devices.

The switch for transferring a signal from a signal source may be a transistor switch made of a bipolar transistor, a CMOS transistor, a MOS transistor or the like, a micro switch or the like.

In the first to fourth embodiments, the signal transmission circuit is applied to a solid state image pickup device.

Figure 1:
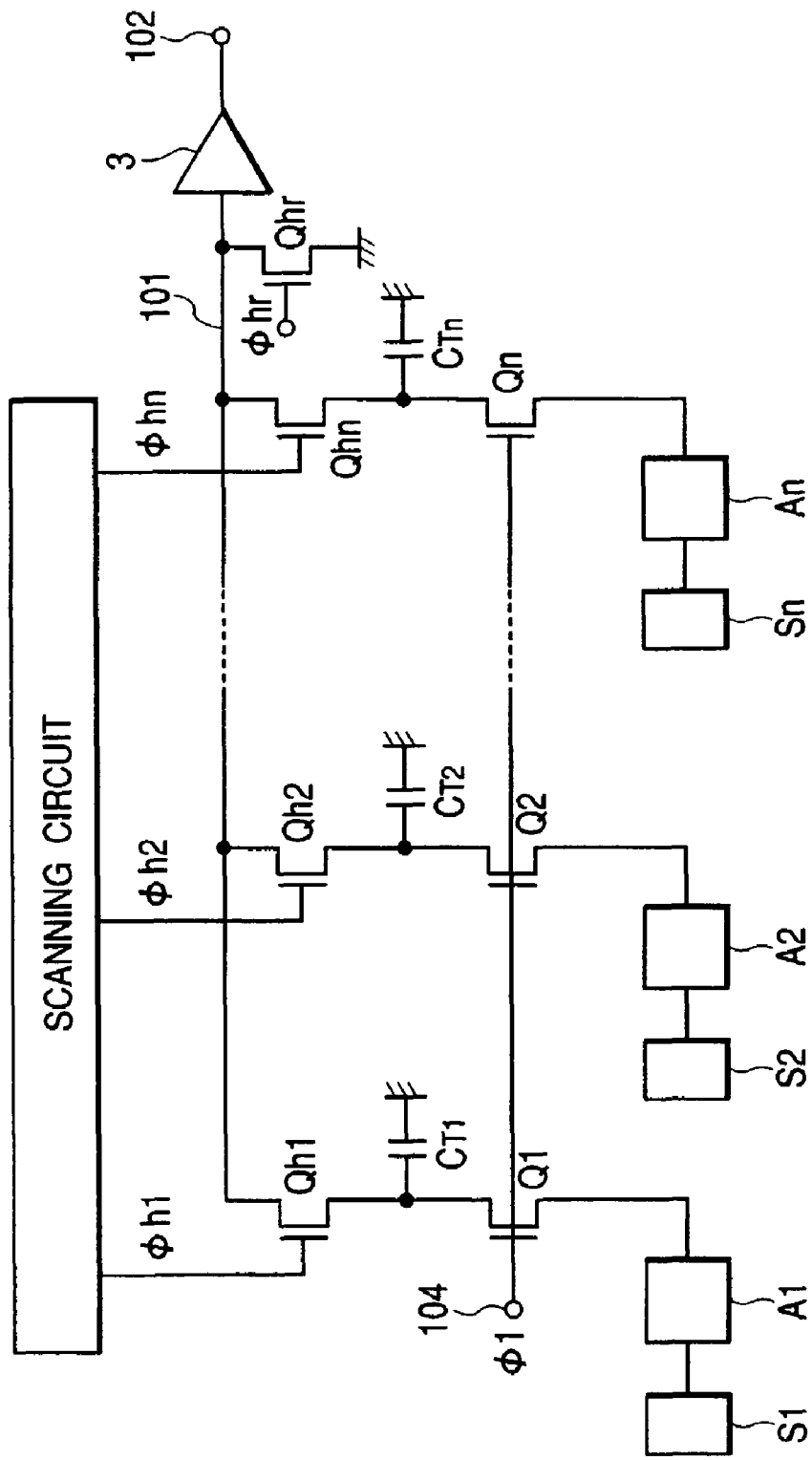
FIG. 1 is a circuit diagram of a conventional solid state image pickup device.
Figure 2:
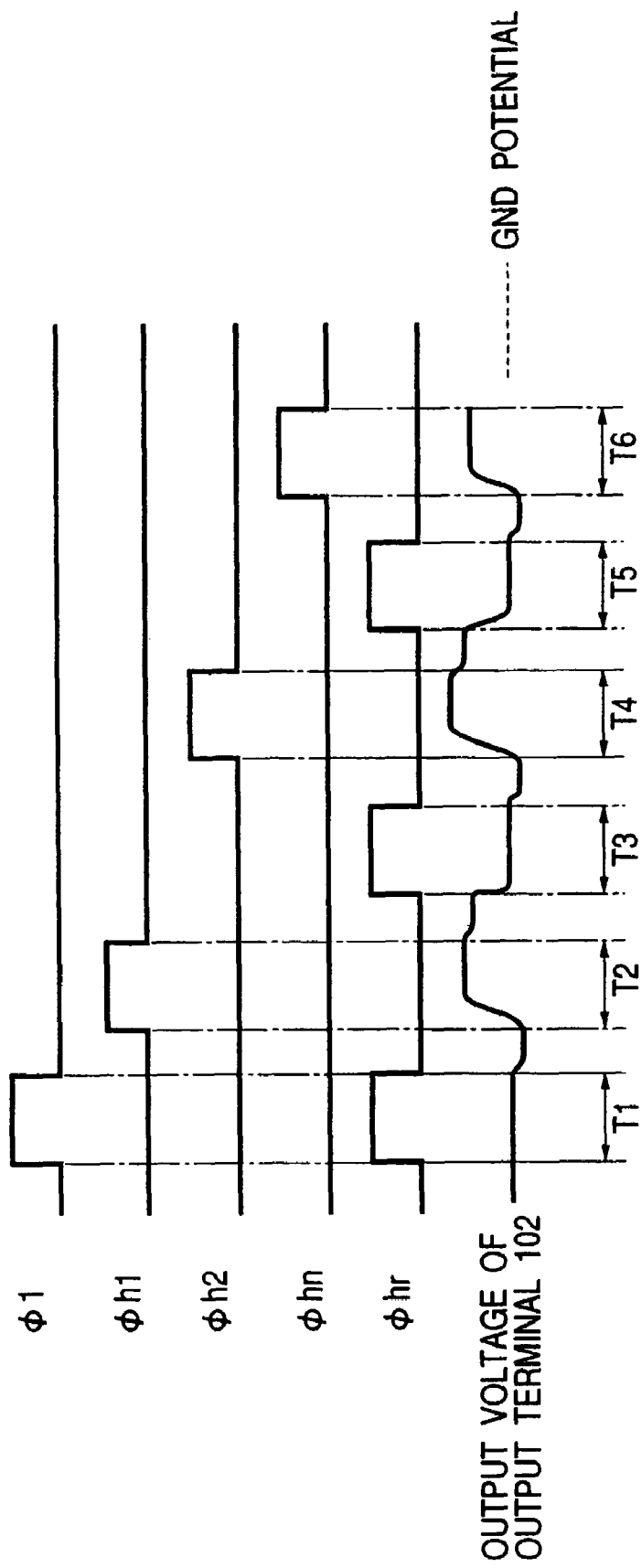
FIG. 2 is a timing chart illustrating the operation of the device shown in FIG. 1.
Figure 11:
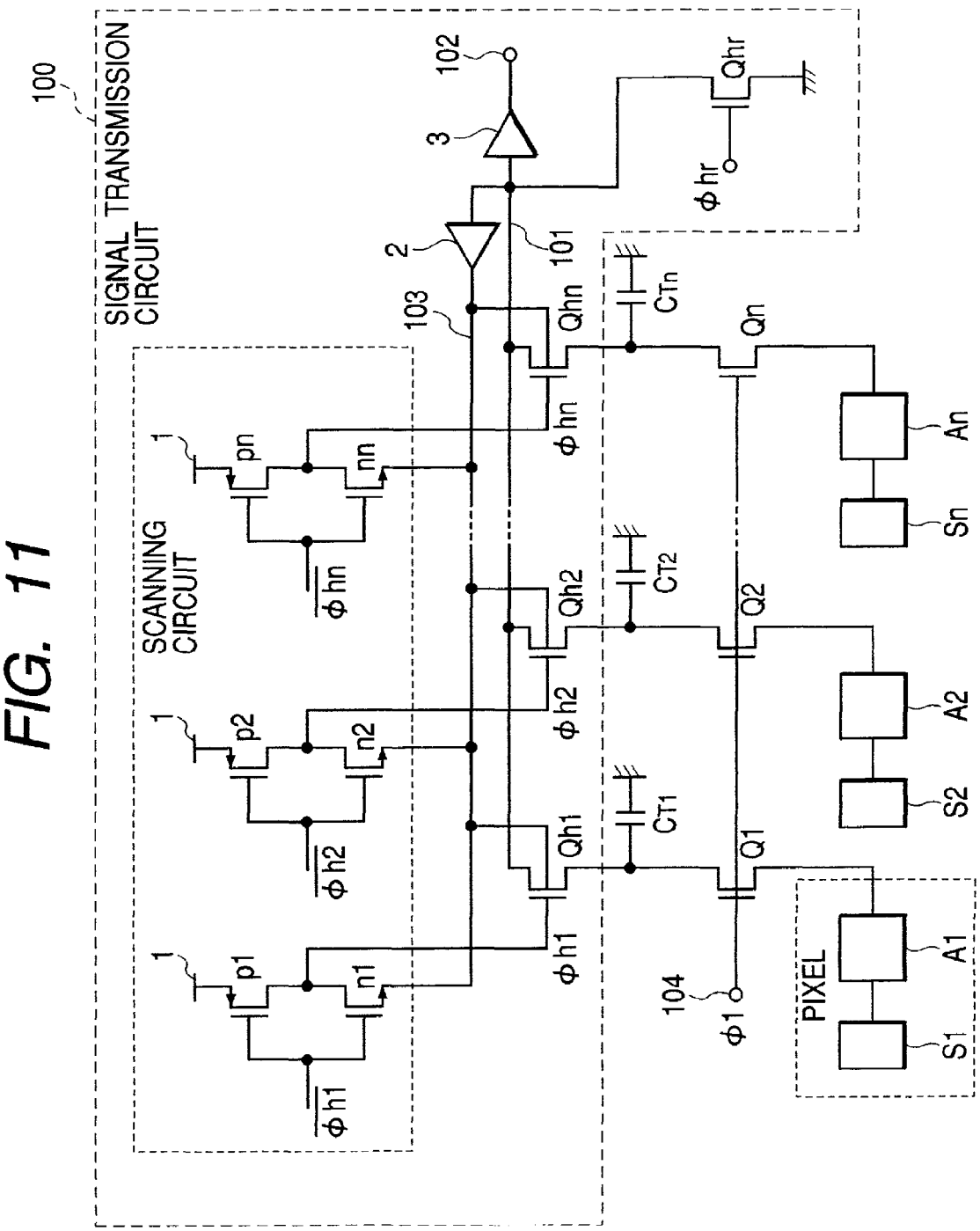
FIG. 11 is a circuit diagram of a solid state image pickup device according to a first embodiment of the invention.

FIG. 11 is a circuit diagram showing the structure of a solid state image pickup device according to the first embodiment of the invention. In FIG. 11, similar elements to those shown in FIG. 1 are represented by using identical reference symbols, and the duplicate explanation of the similar elements and their operations is omitted. In FIG. 11, although pixels are arranged in line, they may be arranged two-dimensionally to form an area sensor. In FIG. 11, a signal transmission circuit 100 is surrounded by a broken line.

The difference between the structure shown in FIG. 11 and that shown in FIG. 1 lies in that back gates (bulk substrate) of MOS transistors Qh1 to Qhn as transfer switches are connected to the output of a buffer amplifier 2 and that in CMOS drivers in the scanning circuit for driving the gates of the MOS transistors Qh1 to Qhn, the sources of NMOS transistors n1 to nn are connected not to the ground line but to the output of the buffer amplifier 2. The buffer amplifier 2 receives the potential at the horizontal signal line 101 and outputs the potential added with a d.c. offset voltage. Reference numeral 1 represents a high potential power source.

Figure 12:
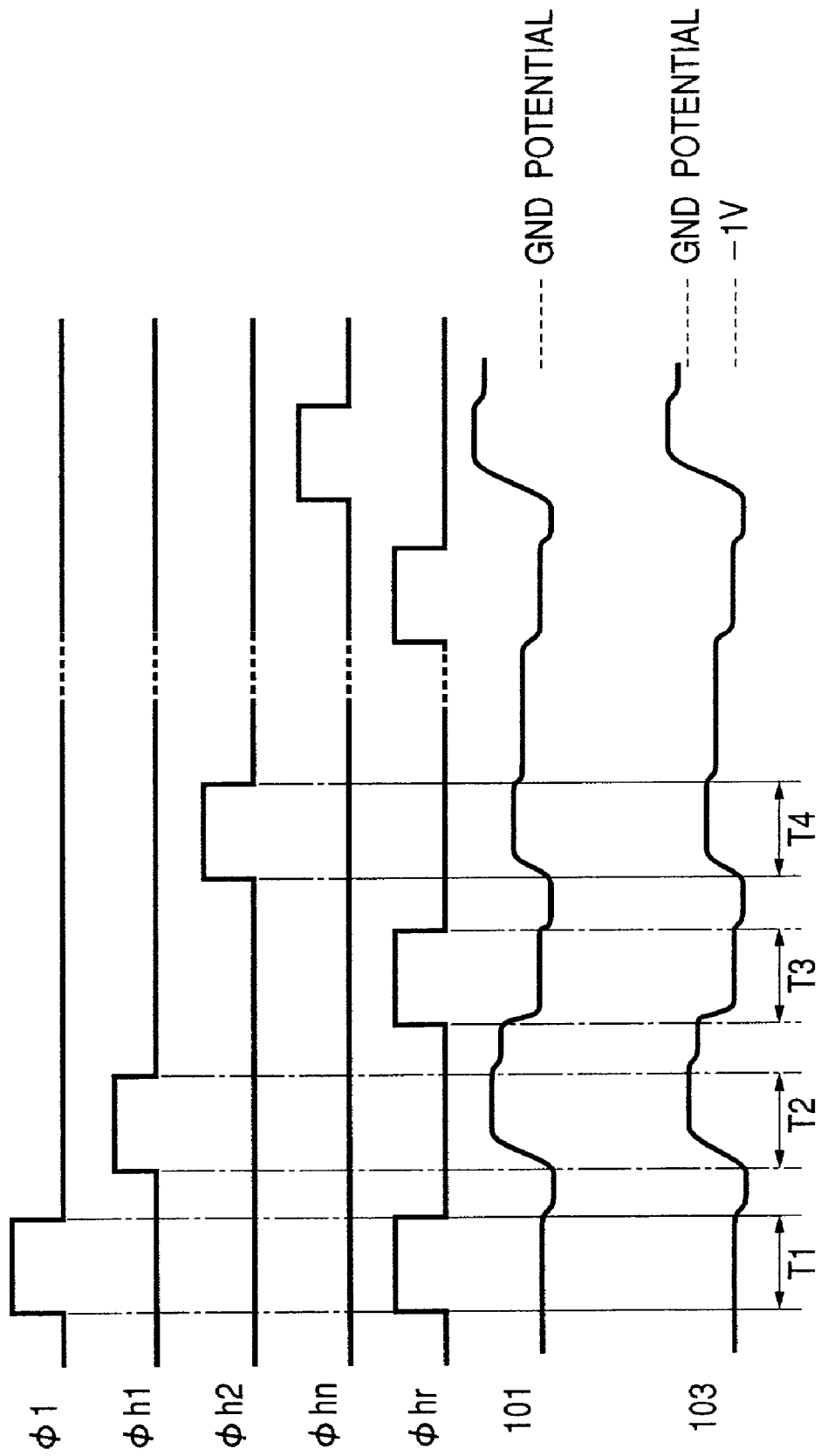
FIG. 12 is a timing chart illustrating the operation of the device shown in FIG. 11.

The operation of the solid state image pickup device will be described with reference to FIG. 12. FIG. 12 is a timing chart illustrating the operation sequence of the solid state image pickup device.

During a period T1, the MOS transistors Q1 to Qn as the transfer switches turn on so that output voltages of the amplifier units A1 to An receiving signal charges of the photoelectric conversion units S1 to Sn of respective pixels are applied to the sample/hold capacitors CT1 to CTn. Thereafter, when the pulse φ1 applied to the terminal 104 takes the low potential, the MOS transistors Q1 to Qn turn off so that the potentials applied to the sample/hold capacitors CT1 to CTn are held therein.

Next, during a period T2, only the pulse φh1 output from the scanning circuit takes the high potential and the other pulses φh2 to φhn take the low potential. Therefore, of PMOS transistors p1 to pn and NMOS transistors n1 to nn constituting the CMOS drivers in the scanning circuit, the PMOS transistor p1 and NMOS transistors n2 to nn turn on, whereas the NMOS transistor n1 and PMOS transistors p2 to pn turn off. Therefore, the MOS transistor Qh1 as the switch for transferring a signal from the sample/hold capacitor CT1 to the horizontal signal line 101 turns on, and the other MOS transistors Qh2 to Qhn as the switches turn off. As the signal voltage is applied from the sample/hold capacitor CT1 to the horizontal signal line 101, the horizontal signal line 101 has some potential. The potential at a wiring line 103 connected to the output of the buffer amplifier 2 takes the potential at the input of the buffer amplifier 2, i.e., the potential at the horizontal signal line 101, added with a d.c. offset voltage. The buffer amplifier 2 is structured so that the amplitude of the d.c. offset voltage is set larger than the output dynamic range of the amplifier units A1 to An and so that the polarity of the d.c. offset voltage is set to allow the MOS transistors Qh1 to Qhn which are the transfer switches to turn off. For example, consider the case wherein the output dynamic range of the amplifier units A1 to An is 1 V, the MOS transistor as the transfer switch is of an n-type, its threshold voltage Vth is 0.7 V, and the d.c. offset voltage is set to −1 V. In this case, the gate-source voltage of the MOS transistors Qh2 to Qhn to be turned off will not become larger than the threshold voltage so that the MOS transistors Qh2 to Qhn continue to be turned off. The gate-source voltage of the MOS transistors Qh2 to Qhn is equal to a difference between the voltage at the horizontal signal line 101 and the voltage at the output 103 of the buffer amplifier 2, and is always constant at 1 V. The source-substrate voltage of the MOS transistors Qh1 to Qhn is also equal to a difference between the voltage at the horizontal signal line 101 and the voltage at the output 103 of the buffer amplifier 2, and is always constant at 1 V. Since the PN junction between the source-substrate of the MOS transistors Qh1 to Qhn is maintained in a backward bias state (may be in an 0 V state), no difficulty arises in the operation of the MOS transistors Qh1 to Qhn.

As described above, the voltage across the electrodes of each of the parasitic capacitances constituting the parasitic capacitance Ch of the horizontal signal line 101 is maintained constant. Therefore, a reduction of a voltage gain is very small when signals are transferred from the sample/hold capacitors CT1 to CTn to the horizontal signal line 101.

Figure 13:
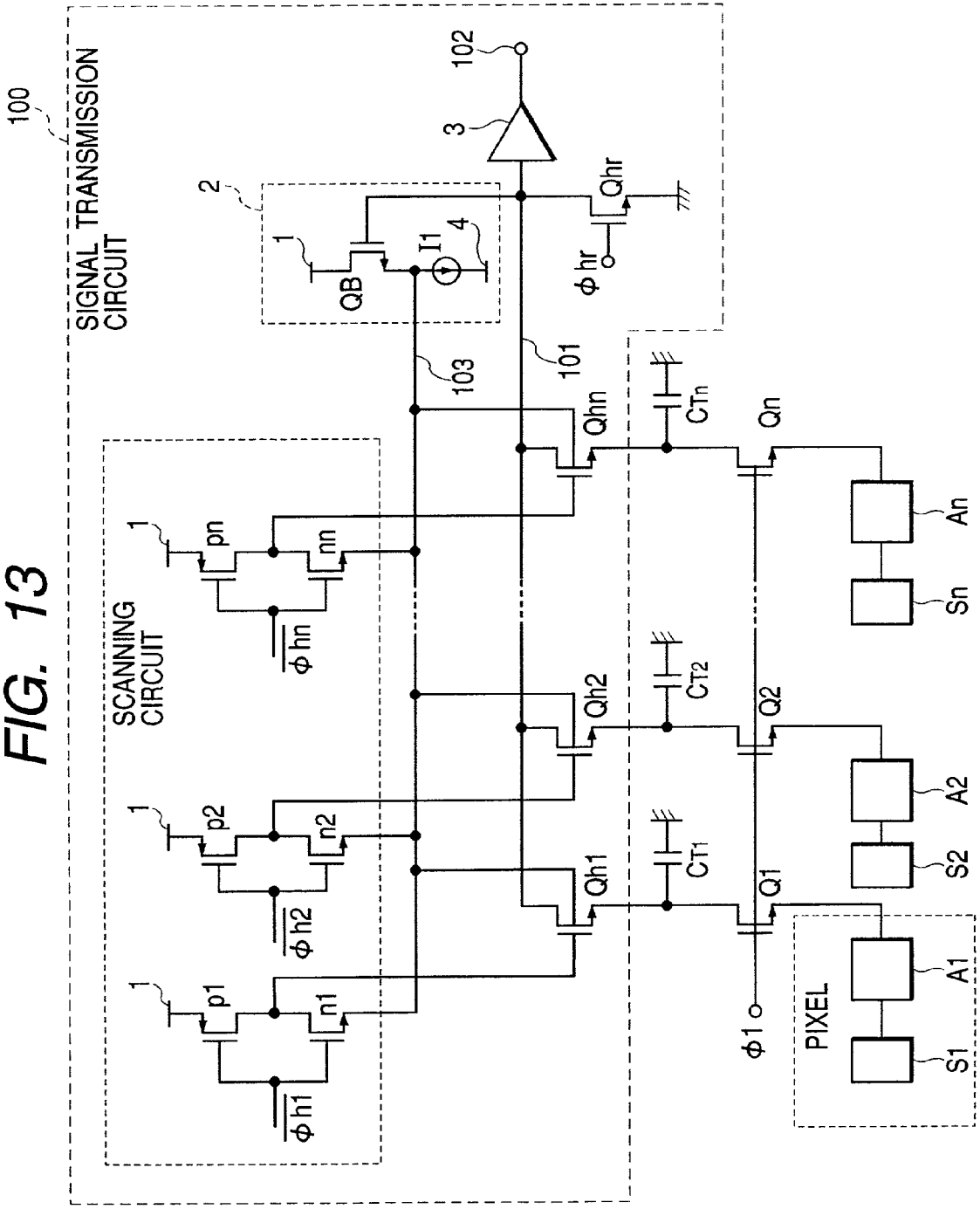
FIG. 13 is a circuit diagram showing a specific example of the device shown in FIG. 11.

FIG. 13 shows an example of the specific circuit structure of the buffer amplifier 2 shown in FIG. 11. In FIG. 11, I1 represents a constant current source, reference numeral 4 represents a negative (−) power source line, $Q_B$ represents an NMOS transistor. As shown in FIG. 13, the buffer amplifier 2 constitutes a source follower. The source voltage of the NMOS transistor $Q_B$ is lower than the gate voltage by:

$$V_{GS}=\sqrt{((2 \cdot I1)/(K \cdot (W/L)))}+Vth$$

and if the value of the output current I1 is constant, the value $V_{GS}$ is also constant, where K is a constant, W and L are the gate width and length of the NMOS transistor $Q_B$, I1 is an output current of the current source I1, and Vth is a threshold voltage of the NMOS transistor.

Figure 17:
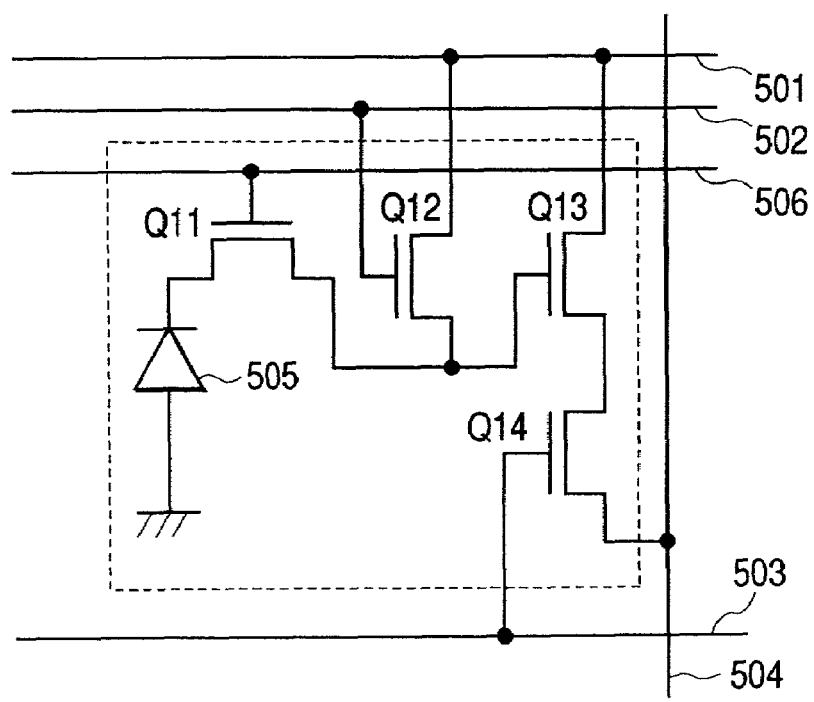
FIG. 17 is an equivalent circuit diagram of a pixel of the solid state image pickup device which can be used in the first to third embodiments.

FIG. 17 is an equivalent circuit of a pixel of the solid state image pickup device usable in this embodiment. In FIG. 17, the pixel is used for an area sensor. If pixels are arranged in line, the select switch Q14 may not be provided.

In FIG. 17, reference numeral 505 represents a photodiode corresponding to the photoelectric conversion unit. Q13 represents an input MOS transistor of a source follower amplifier as the amplifier unit. Q14 represents a select switch for selecting a row to be read. Although a constant current load of the source follower is not shown, it is connected to a signal output line 504. Q12 represents a reset switch for resetting the input terminal of the source follower. The reset switch Q12 resets the input unit of the amplifier unit. Q11 represents a transfer switch as the charge transfer unit for transferring an optical signal from the photodiode 505 to the input unit of the amplifier unit which is the source follower. Reference numeral 501 represents a power source line, reference numeral 502 represents a reset switch line, reference numeral 503 represents a select switch line, and reference numeral 506 represents a transfer switch line.

Parasitic capacitance controlling unit of this embodiment is constituted of the buffer amplifier 2 connected to the horizontal signal line 101 and the wiring line 103 for connecting the buffer amplifier 2 to the back gates of the MOS transistors Qh1 to Qhn and to the sources of the NMOS transistors n1 to nn.

Figure 3:
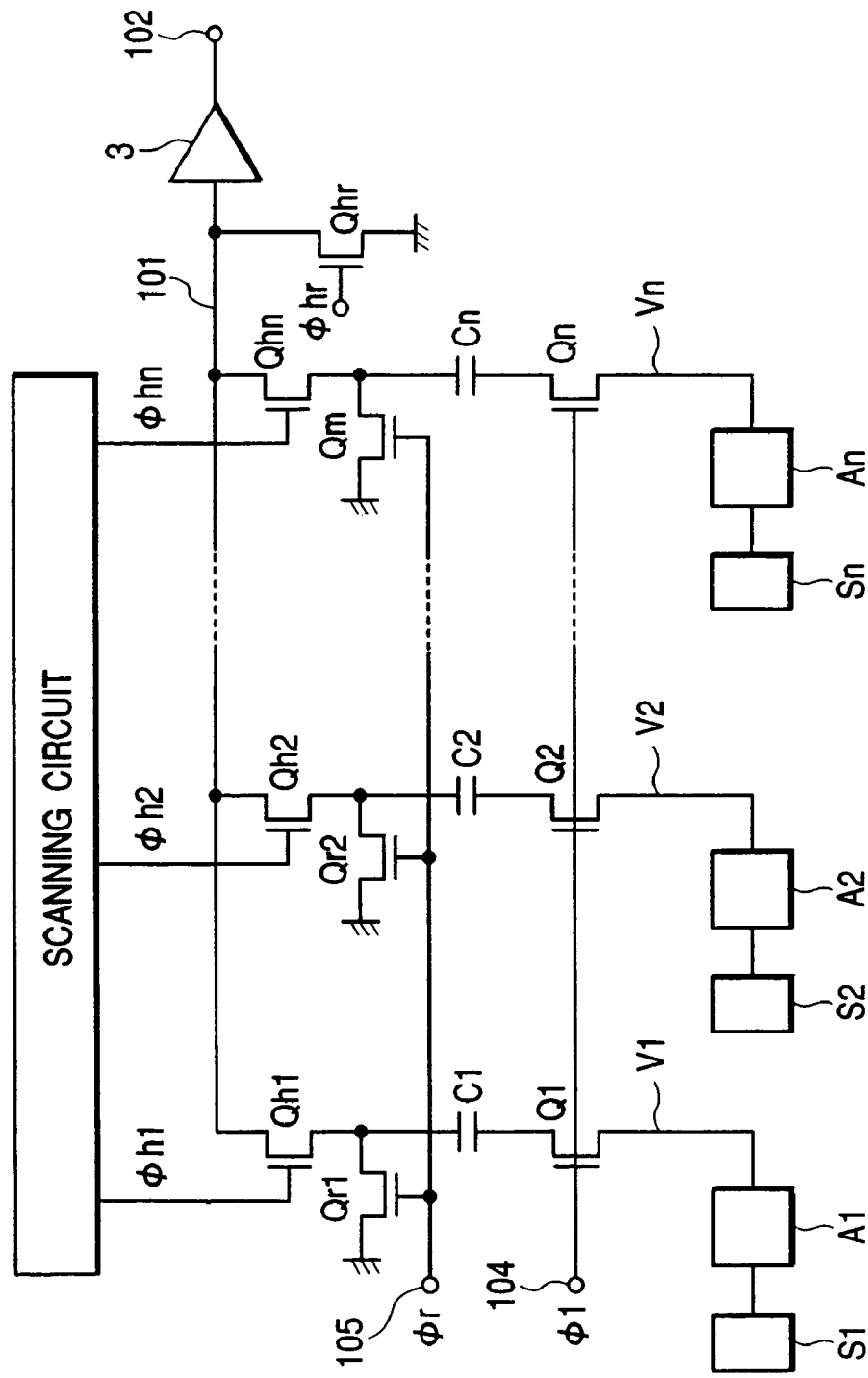
FIG. 3 is a circuit diagram of a conventional solid state image pickup device.
Figure 4:
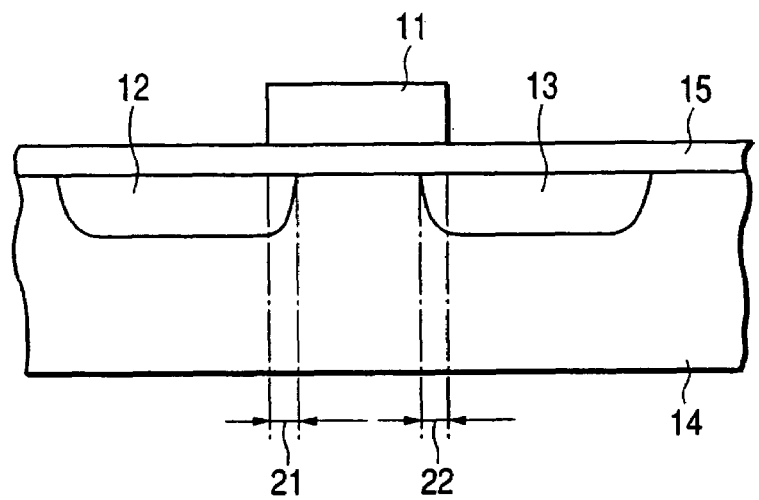
FIG. 4 is a schematic diagram showing two parasitic capacitances constituting a capacitance Ch.
Figure 14:
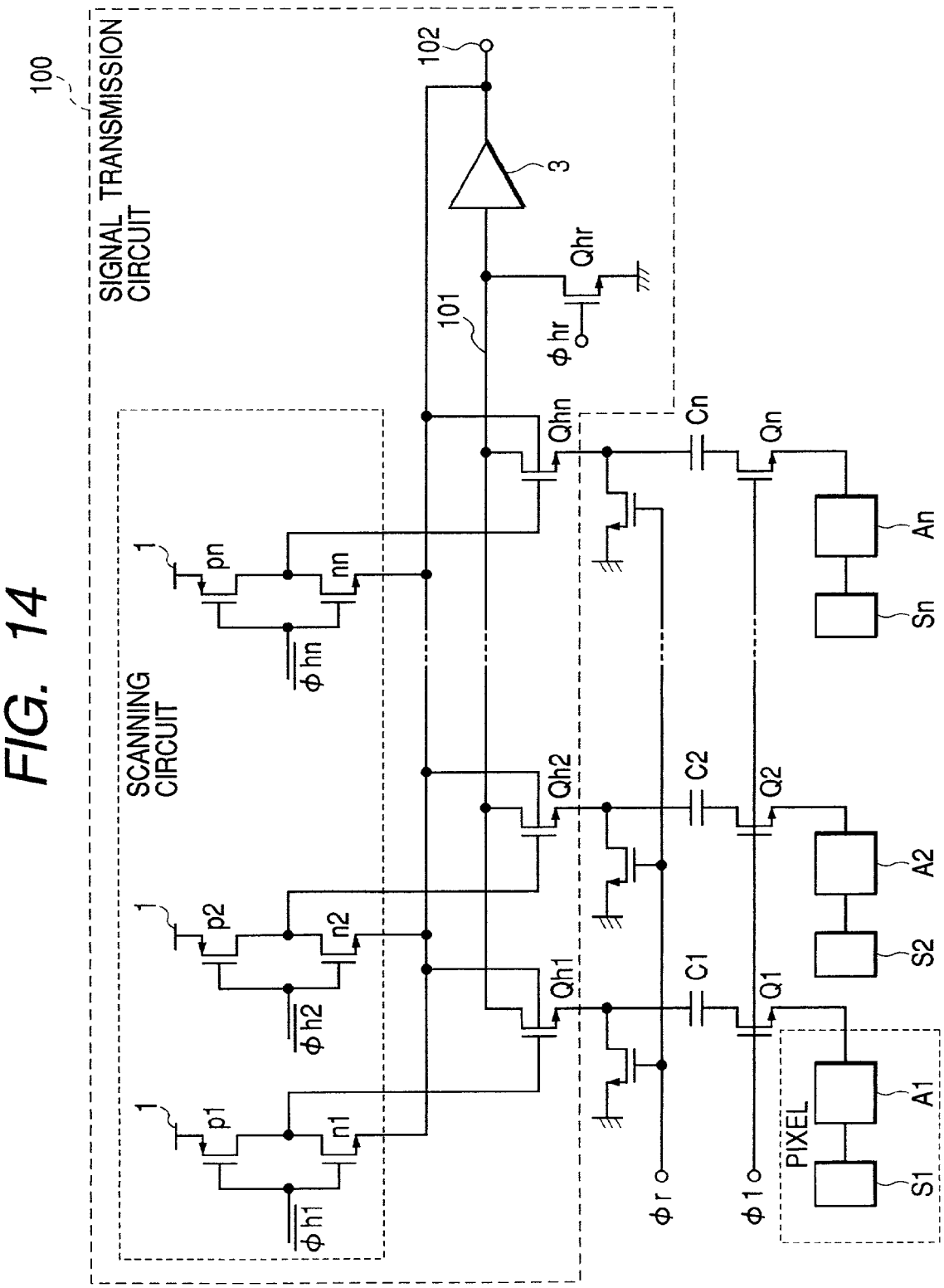
FIG. 14 is a circuit diagram of a solid state image pickup device according to a second embodiment of the invention.

FIG. 14 is a circuit diagram showing the structure of a solid state image pickup device according to the second embodiment of the present invention. As compared to the conventional circuit shown in FIG. 3 in which a signal is transferred by using a clamp capacitor, the second embodiment does not use the buffer amplifier 2 shown in FIG. 11, but the output of the output amplifier 3 drives the back gates (bulk substrate) of the MOS transistors Qh1 to Qhn which are the transfer switches, and the gates of the MOS transistors Qh1 to Qhn via the NMOS transistors n1 to nn.

In this embodiment, parasitic capacitance controlling unit is constituted of the output buffer amplifier 3 connected to the horizontal signal line 101 and the wiring line 103 for connecting the output buffer amplifier 3 to the back gates of the MOS transistors Qh1 to Qhn and to the sources of the NMOS transistors n1 to nn.

Figure 15:
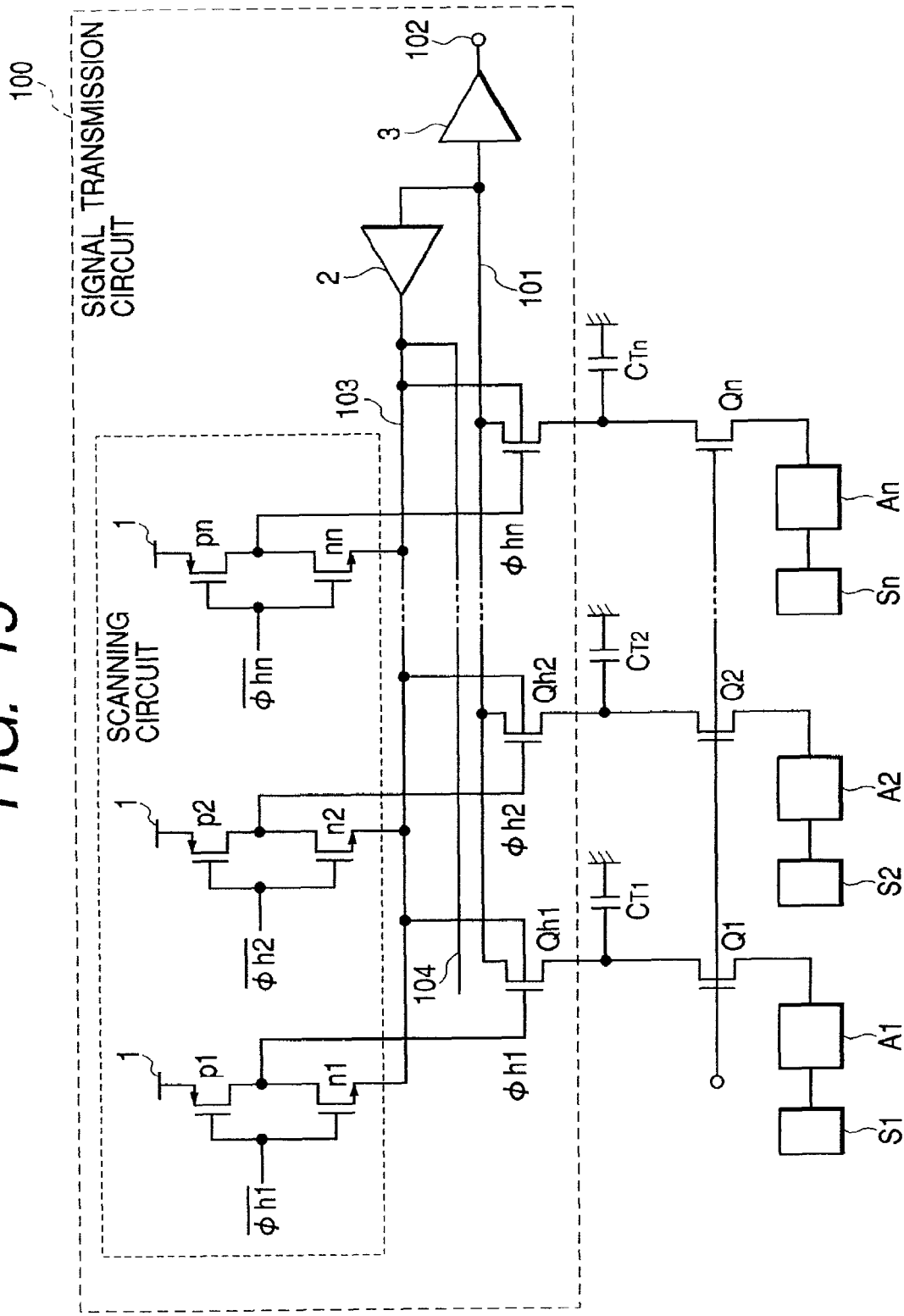
FIG. 15 is a circuit diagram of a solid state image pickup device according to a third embodiment of the invention.

FIG. 15 is a circuit diagram showing the structure of a solid state image pickup device according to the third embodiment of the invention.

If the common horizontal signal line 101 is required to be optically shielded, a wiring layer of Al or the like covers the upper surface of the common horizontal signal line 101 made of a wiring layer of Al or the like. In this case, between these two wiring layers, a parasitic capacitance C having an interlayer insulating layer which is a dielectric layer is formed. The parasitic capacitance of the common horizontal signal line 101 therefore increases and the signal transfer gain lowers.

To solve this problem, the upper wiring layer for optical shielding is driven by a buffer amplifier which receives the potential at the common signal line 101 and outputs this potential. In this manner, electric charges will not enter the parasitic capacitance between the upper wiring layer for optical shielding and the common signal line 101 and an apparent parasitic capacitance is removed.

If an additional buffer amplifier for driving the upper wiring layer of Al or the like for optical shielding is used and the input of this buffer amplifier is connected to the common horizontal signal line, then a parasitic capacitance of the common horizontal signal line 101 increases because the additional buffer amplifier has an input capacitance.

To avoid this, the buffer amplifier for driving the back gates and the like of the MOS transistor which is the transfer switch is used in common as the buffer amplifier for driving the upper wiring layer of Al or the like for optical shielding.

Figure 16:
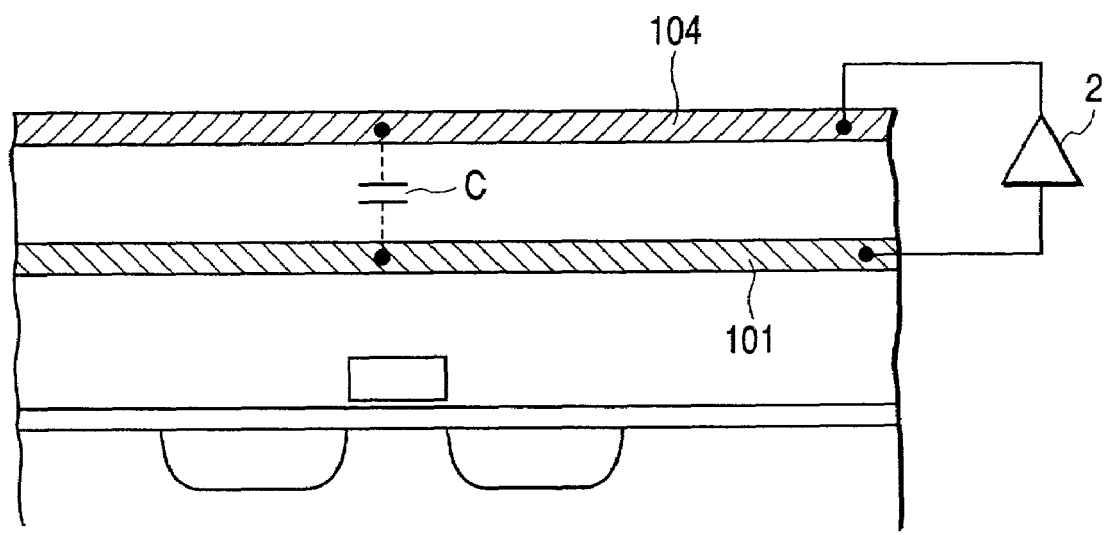
FIG. 16 is a schematic cross sectional view showing a wiring line for controlling a parasitic capacitance of a common line.

The structure shown in FIG. 15 is almost the same as that shown in FIG. 11, excepting an addition of a wiring line 104 to the structure of FIG. 11. This wiring line 104 is used as the upper wiring layer for optical shielding and connected to the output of the buffer amplifier 2. FIG. 16 is a schematic cross sectional view showing the wiring line 104.

In this embodiment, parasitic capacitance controlling unit is constituted of the buffer amplifier 2 connected to the horizontal signal line, the wiring line 103 for connecting the buffer amplifier 2 to the back gates of the MOS transistors Qh1 to Qhn and to the sources of the NMOS transistors n1 to nn, and the wiring line 104 connected to the buffer amplifier 2.

As described above, according to the first to third embodiments, when signals from a plurality of signal sources are output via switches to the common signal line, the parasitic capacitance of the common line is controlled to suppress a flow of signal charges into the parasitic capacitance. A reduction of the signal transfer gain can be made very small.

Figure 18:
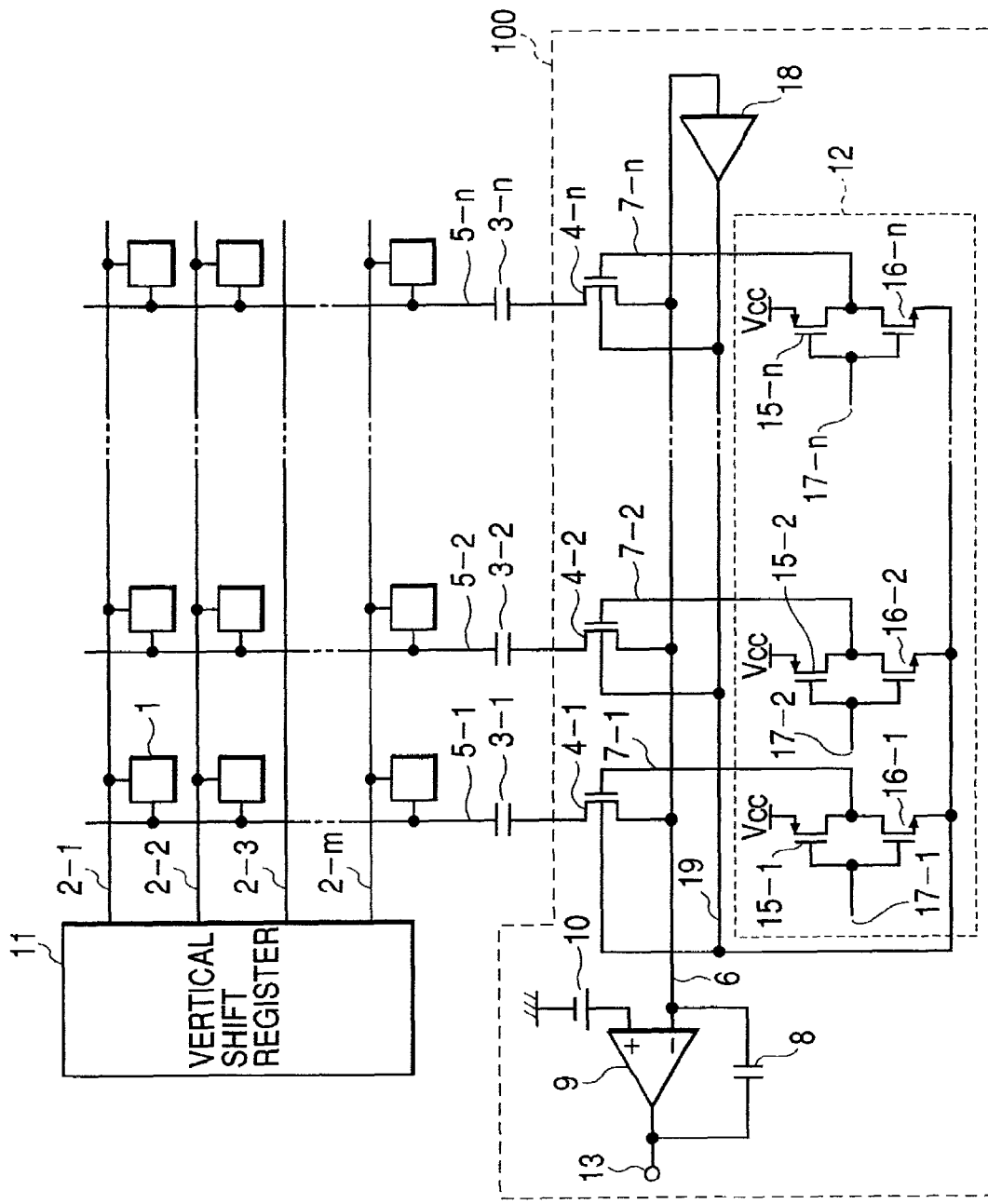
FIG. 18 is a circuit diagram showing a solid state image pickup device according to a fourth embodiment of the invention.

FIG. 18 is a circuit diagram showing the structure of a solid state image pickup device according to the fourth embodiment of the invention. In this embodiment, sensor cells are arranged two-dimensionally in a matrix shape to form the solid state image pickup device.

In FIG. 18, reference numeral 1 represents a sensor cell which is activated and reset by a signal 2 (2-1, 2-2, . . . , 2-*n*)

supplied from a vertical shift register 11. An output of each sensor cell 1 is connected to a vertical signal line 5 (5-1, 5-2, ..., 5-n). A signal voltage generated at the sensor cell 1 appears on the vertical signal line 5 and is stored in a clamp capacitor 3 (3-1, 3-2, ..., 3-n) in the form of signal charges. Thereafter, when horizontal select switches 4 (4-1, 4-2, ..., 4-n) are sequentially turned on by horizontal select signals 7 (7-1, 7-2, ..., 7-n) supplied from a horizontal shift resister (scanning circuit) 12, the signal charges in the clamp capacitors 3 are transferred via a horizontal signal line 6 to the inverting input terminal of a differential amplifier 9 having a negative feedback capacitor 8 and output from an output terminal 13 in the form of voltage. The non-inverting input terminal of the differential amplifier 9 is connected to a reference voltage source 10. Reference numeral 100 represents a signal transmission circuit.

The operation of transferring signal charges on the vertical signal line of the first column to the horizontal signal line via the clamp capacitors will be described by way of example. It is herein assumed that an input terminal 17-1 of a CMOS inverter (15-1, 16-1) for driving a horizontal transfer switch 4-1 of the first column in the horizontal shift register 12 takes an "L" level, whereas the input terminals (17-2, ..., 17-n) of the other CMOS inverters (15-2, 16-2, ..., 15-n, 16-n) in the horizontal shift register 12 take an "H" level. In the CMOS inverter structure, the source of a PMOS transistor 15 (15-1, 15-2, ..., 15-n) is connected to a power source and the drain is connected to an output terminal, whereas the drain of an NMOS transistor 16 (16-1, 16-2, ..., 16-n) is connected to the output terminal and the source is connected to a wiring line 19 which is connected to the output terminal of a buffer amplifier 18. A different point of the CMOS inverter shown in FIG. 18 from a general CMOS inverter resides in that the source of the NMOS transistor 16 is connected to the wiring line 19 connected to the output terminal of the buffer amplifier 18.

The input terminal 17-1 takes the "L" level, the PMOS transistor 15-1 turns on and the NMOS transistor 16-1 turns off so that the horizontal select signal line 7-1 of the first column takes the "H" level. The PMOS transistors 15-2, ..., 15-n turn off and the NMOS transistors 16-2, ..., 16-n turn on so that the potentials of the horizontal select signal lines 7-2, ..., 7-n of the second and following columns are equal to the output potential of the buffer amplifier 18. If the buffer amplifier 18 is structured so that it can output the potential at the horizontal signal line 6 connected to the input of the buffer amplifier, added with a d.c. offset voltage, the potentials of the horizontal select signal lines 7-2, ..., 7-n of the second and following columns are equal to the potential which is the sum of potential at the horizontal signal line 6 and d.c. offset voltage.

Therefore, the gate-source voltage (some d.c. voltage) of the horizontal select switch 4-2, ..., 4-n of the second and following columns takes a constant value.

The wiring line 19 is also connected to the well region of each horizontal select switch 4 so that the source-well voltage takes a constant value similar to the gates described above.

As understood from the above description, the voltage across each of the two parasitic capacitances (gate-source overlapping capacitance Cov and source-well overlapping capacitance Cj) takes a constant value. Since electric charges do not move, the parasitic capacitances do not function apparently.

Figure 19:
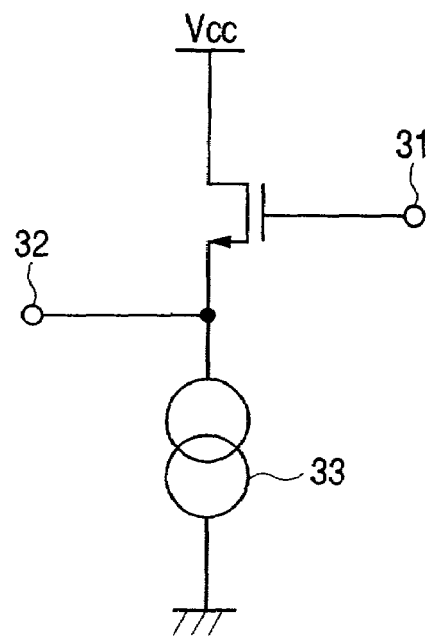
FIG. 19 is a diagram showing an example of a buffer amplifier of the fourth embodiment.

FIG. 19 shows an example of the buffer amplifier 18 shown in FIG. 18. The buffer amplifier constitutes an NMOS source follower. Reference numeral 31 represents an input terminal, reference numeral 32 represents an output terminal, and reference numeral 33 represents a bias current source.

A voltage across the input and output terminals is equal to the gate-source voltage of the NMOS transistor. This voltage can be set to any value by controlling the gate width and length of the NMOS transistor and the current of the current source 33. This voltage value is set so that the PN junction between the source/drain—well of the horizontal transfer switch 4 shown in FIG. 18 is not biased forward under every and each drive condition.

A gate for driving the horizontal select line 7 by the horizontal shift register 12 shown in FIG. 18 is not limited only to the inverter, but other circuits may also be used so long as they satisfy the conditions that the potential at the horizontal select line 7 becomes equal to the output potential of the buffer amplifier 18 shown in FIG. 18 while the horizontal transfer switch 4 turns off and that the "H" level is output while the horizontal transfer switch 4 turns on. The amplifier 9 is not necessarily differential, but an amplifier with a single input terminal such as a CMOS inverter may also be used. In FIG. 18, although signal charges on the vertical signal line are transferred via the clamp capacitor to the horizontal signal line, the signal charges may be transferred via a sample/hold circuit to the horizontal signal line, with similar expected technological advantages.

Figure 20:
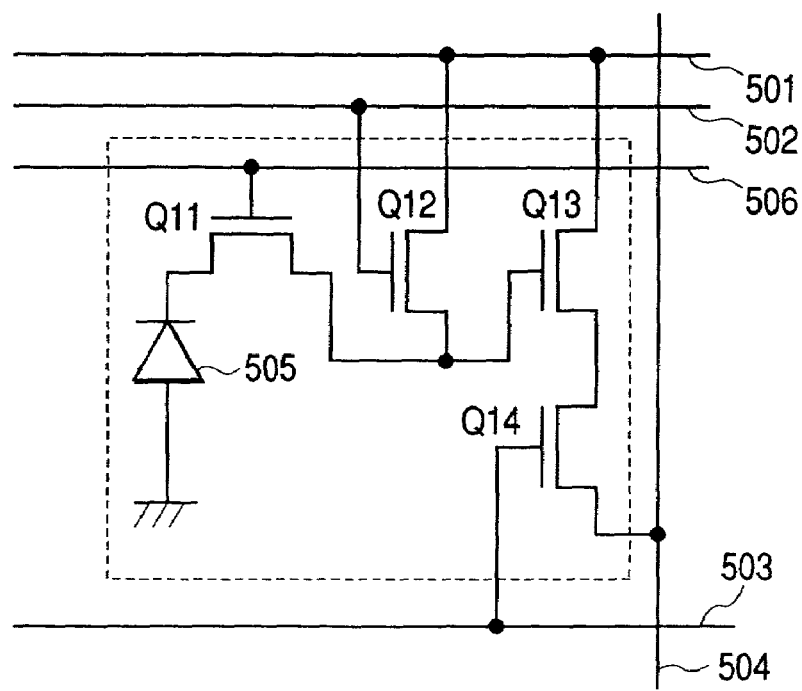
FIG. 20 is an equivalent circuit diagram of a pixel of the solid state image pickup device which can be used in the fourth embodiment.

FIG. 20 is an equivalent circuit of a pixel of the solid state image pickup device usable in this embodiment. In FIG. 20, the pixel is used for an area sensor. If pixels are arranged in line, the select switch Q14 may not be required.

In FIG. 20, reference numeral 505 represents a photodiode corresponding to the photoelectric conversion unit. Q13 represents an input MOS transistor of a source follower amplifier as the amplifier unit. Q14 represents a select switch for selecting a row to be read. Although a constant current load of the source follower is not shown, it is connected to a signal output line 504. Q12 represents a reset switch for resetting the input terminal of the source follower. The reset switch Q12 resets the input unit of the amplifier unit. Q11 represents a transfer switch as the charge transfer unit for transferring an optical signal from the photodiode 505 to the input unit of the amplifier unit which is the source follower. Reference numeral 501 represents a power source line, reference numeral 502 represents a reset switch line, reference numeral 503 represents a select switch line, and reference numeral 506 represents a transfer switch line.

Figure 21:
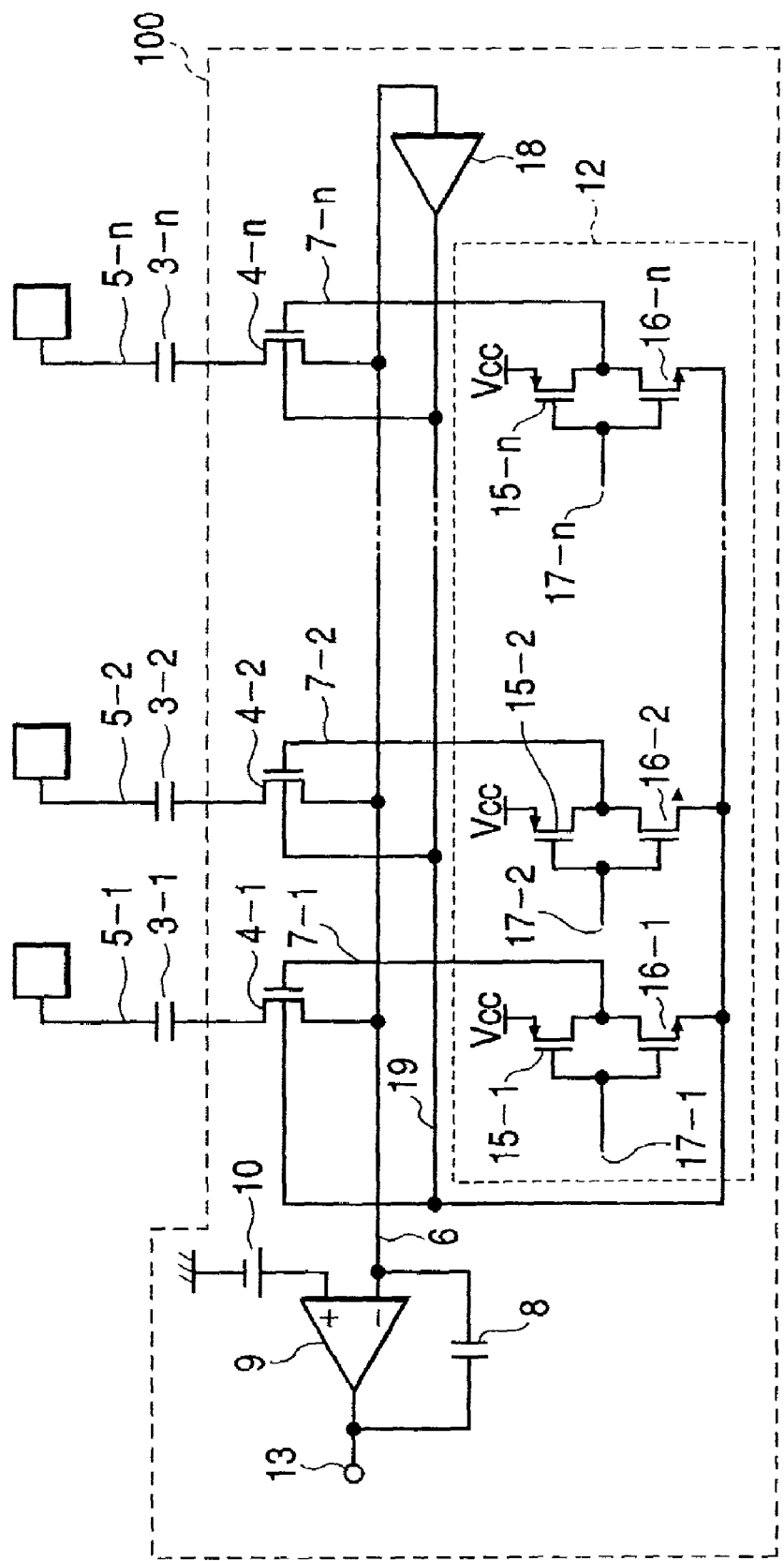
FIG. 21 is a circuit diagram showing a solid state image pickup device with pixels disposed in line according to another embodiment of the invention.

FIG. 21 is a circuit diagram showing a solid state image pickup device according to another embodiment of the present invention in which pixels are disposed in line. This solid state image pickup device has similar technological advantages to those of the solid state image pickup device shown in FIG. 18. In this embodiment, parasitic capacitance controlling unit is constituted of a buffer amplifier 18 and a wiring line 19 for connecting the buffer amplifier 18 to the back gates of horizontal select switches and NMOS transistors 16.

As described above, according to the present embodiment, an apparent capacitance of the common line is removed. The parasitic capacitance of the input terminal of the output amplifier, i.e., the parasitic capacitance of the horizontal signal line, can be reduced considerably. The output amplifier can therefore operate at high speed and random noises of the output amplifier can be suppressed.

Figure 22:
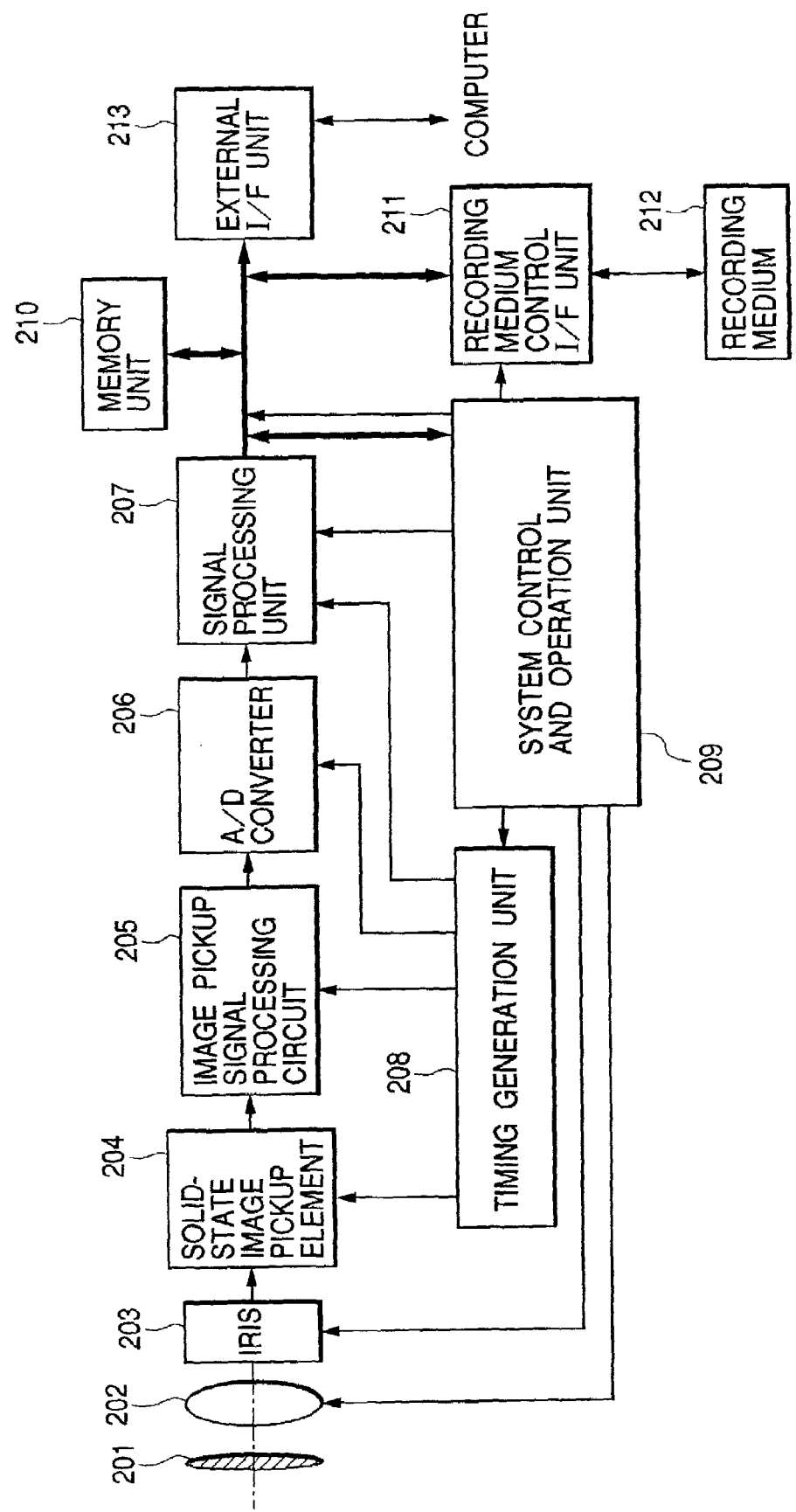
FIG. 22 is a block diagram of a camera using the solid state image pickup device of the present invention.

With reference to FIG. 22, the fifth embodiment will be described in which the solid state image pickup device of one of the first to fourth embodiments is applied to a still camera (image pickup apparatus).

In FIG. 22, reference numeral 201 represents a barrier functioning as both a lens protector and a main switch. Reference numeral 202 represents a lens for focussing an optical image of an object upon a solid state image pickup device 204 which picks up an image signal of the optical image of the object focussed by the lens 202. Reference numeral 203 represents an iris for controlling the amount of light passed through the lens 202. Reference numeral 206 represents an A/D converter for converting an analog image signal output from the solid state image pickup device 204 into a digital image signal. Reference numeral 207 represents a signal processing unit for performing various corrections and compression of image data output from the A/D converter 206. Reference numeral 208 represents a timing generation unit for outputting various timing signals to the solid state image pickup device 204, image pickup signal processing circuit 205, A/D converter 206 and signal processing unit 207. Reference numeral 209 represents a system control and operation unit for performing various calculations and controlling the whole part of the camera. Reference numeral 210 represents a memory for temporarily storing image data. Reference numeral 211 represents an interface unit for read/write of a removable recording medium 212 such as a semiconductor memory for read/write of image data. Reference numeral 213 represents an interface unit for communications with external computer or the like.

Next, the image pickup operation of the still video camera constructed as above will be described.

As the barrier 201 is opened, a main power source is turned on, then a power source for a control system turns on, and thereafter a power source for an image pickup circuitry such as the A/D converter 6 is turned on.

Next, in order to control an exposure amount, the system control and operation unit 209 opens the iris 203 fully. A signal output from the solid state image pickup device 204 is converted into a digital image signal by the A/D converter 206 and input to the signal processing unit 207. In accordance with this data, the system control and operation unit 209 calculates the exposure amount.

A brightness is judged from this photometry, and in accordance with this judgement result, the system control and operation unit 209 controls the iris.

Next, after high frequency components of a signal output from the solid state image pickup device 204 are removed, the system control and operation unit 209 calculates the distance to an object. Thereafter, the lens is driven, and it is judged whether the lens is in-focus. If it is judged that the lens is out-of-focus, the lens is again driven to again perform range finding. After the in-focus is confirmed, real exposure starts.

After this exposure, an image signal output from the solid state image pickup device 204 is A/D converted by the A/D converter 206 and written in the memory unit via the signal processing unit 207 under the control of the system control and operation unit 209.

Thereafter, the data stored in the memory unit 210 is recorded in the removable recording medium 212 such as a semiconductor memory via the recording medium control I/F unit under the control of the system control and operation unit 209.

Image signals may be input via the external I/F unit 213 directly to a computer or the like to process the image signals thereat.

Many widely different embodiments of the present invention may be constructed without departing from the spirit and scope of the present invention. It should be understood that the present invention is not limited to the specific embodiments described in the specification, except as defined in the appended claims.

What is claimed is:

1. A signal processing apparatus comprising:
   a common line for reading a plurality of signals from a plurality of signal sources;
   a plurality of switching means for transferring the signals from the signal sources to said common line;
   a plurality of pixels each including a photoelectric conversion unit, wherein said photoelectric conversion units provide said signal sources for supplying the signals to said switching means; and
   a parasitic capacitance controlling unit for controlling a change in potential at one electrode of a parasitic capacitance of said common line depending on a change in a signal level of said common line when the signals are read via said switching means to said common line, wherein said parasitic capacitance controlling unit has a buffer amplifier connected to said common line, said buffer amplifier having an output connected to a back gate of each of said switching means for outputting a voltage to which a DC offset voltage is added, and wherein the DC offset voltage has an absolute value larger than a dynamic range of an output from an amplifying portion included in the pixel, and a polarity for turning off the switching means.

2. A signal processing apparatus according to claim 1, wherein the parasitic capacitance includes a parasitic capacitance of said switching means.

3. A signal processing apparatus according to claim 1, further comprising a charge-voltage conversion amplifier connected to said common line for converting a charge into a voltage.

4. A signal processing apparatus according to claim 1, further comprising:
   a lens for focusing light upon said pixels;
   an analog/digital conversion circuit for converting a signal supplied from each of said pixels into a digital signal; and
   a signal processing circuit for processing a signal supplied from said analog/digital conversion circuit.

* * * * *

UNITED STATES PATENT AND TRADEMARK OFFICE
CERTIFICATE OF CORRECTION

PATENT NO. : 7,030,915 B2
APPLICATION NO. : 09/795151
DATED : April 18, 2006
INVENTOR(S) : Takamasa Sakuragi It is certified that error appears in the above-identified patent and that said Letters Patent is hereby corrected as shown below:

Column 3

Line 60, "resister" should read --register--.

Column 5

Line 14, "$(1/SC_{101})/(1/SC_N)$" should read --$(1/SC_{101})/((1/SC_N)$--; and
Line 25, "noises" should read --noise--.

Signed and Sealed this

Twenty-first Day of November, 2006

JON W. DUDAS
*Director of the United States Patent and Trademark Office*